United States Patent
Park et al.

(10) Patent No.: US 11,680,390 B2
(45) Date of Patent: Jun. 20, 2023

(54) NON-POWERED SEAWATER PUMPING SYSTEM FOR REDUCING SEAWATER INTRUSION, AND APPARATUS AND METHOD FOR OPTIMAL DESIGN OF WELL IN THE SAME SYSTEM

(71) Applicant: DONG-A UNIVERSITY RESEARCH FOUNDATION FOR INDUSTRY-ACADEMY COOPERATION, Busan (KR)

(72) Inventors: Namsik Park, Busan (KR); Byunghee Nam, Busan (KR)

(73) Assignee: DONG-A UNIVERSITY RESEARCH FOUNDATION FOR INDUSTRY-ACADEMY COOPERATION, Busan (KR)

( * ) Notice: Subject to any disclaimer, the term of this patent is extended or adjusted under 35 U.S.C. 154(b) by 263 days.

(21) Appl. No.: 17/026,312

(22) Filed: Sep. 21, 2020

(65) Prior Publication Data

US 2021/0002872 A1  Jan. 7, 2021

Related U.S. Application Data

(62) Division of application No. 15/520,305, filed as application No. PCT/KR2017/000219 on Jan. 6, 2017, now Pat. No. 10,815,648.

(30) Foreign Application Priority Data

Nov. 15, 2016  (KR) .................. 10-2016-0151781

(51) Int. Cl.
  *E03B 3/11*  (2006.01)
  *E02B 1/00*  (2006.01)
  (Continued)

(52) U.S. Cl.
  CPC .............. *E03B 3/11* (2013.01); *E02B 1/00* (2013.01); *E03B 3/15* (2013.01); *G06F 30/28* (2020.01); *E02D 19/10* (2013.01)

(58) Field of Classification Search
  CPC ...................................... E03B 3/15; E03B 3/11
  See application file for complete search history.

(56) References Cited

U.S. PATENT DOCUMENTS

| 4,830,111 A * | 5/1989 | Jenkins | E21B 37/08 |
|---|---|---|---|
| | | | 166/303 |
| 4,898,495 A * | 2/1990 | Lin | E02B 3/023 |
| | | | 405/74 |

(Continued)

FOREIGN PATENT DOCUMENTS

| CN | 109162411 A | 1/2019 |
|---|---|---|
| JP | 2008169622 A | 7/2008 |

(Continued)

OTHER PUBLICATIONS

Lei Shi et al., "Applicability of a Sharp-Interface Model in Simulating Saltwater Contents of a Pumping Well in Coastal Areas," The Journal of Engineering Geology, Mar. 2009, pp. 9-14, vol. 19, No. 1, English abstract.

(Continued)

*Primary Examiner* — Sean D Andrish
(74) *Attorney, Agent, or Firm* — Cantor Colburn LLP

(57) ABSTRACT

Disclosed is a non-powered seawater pumping apparatus for reducing seawater intrusion in a land in which an aquifer with a seawater-fresh water boundary surface is formed. The seawater pumping apparatus includes a pumping pipe having two open end portions, a first end portion of the open end portions being positioned below a sea level and a second end portion being positioned below the seawater-fresh water boundary surface in the land, and a well disposed to surround a lateral surface of a land-buried portion of the (Continued)

pumping pipe, which is buried in the land, so as to space away the land-buried portion of the pumping pipe from the land. The pumping pipe is filled with seawater, and the well comprises a screen having a plurality of through holes formed along a circumference of the well at a lower end portion of the well.

4 Claims, 14 Drawing Sheets

(51) Int. Cl.
*E03B 3/15* (2006.01)
*G06F 30/28* (2020.01)
*E02D 19/10* (2006.01)

(56) References Cited

U.S. PATENT DOCUMENTS

| | | | |
|---|---|---|---|
| 9,964,425 B2 | 5/2018 | Kim et al. | |
| 2014/0193201 A1* | 7/2014 | Stauffer | E02B 9/06 |
| | | | 405/75 |

FOREIGN PATENT DOCUMENTS

| | | |
|---|---|---|
| KR | 1020110023871 A | 3/2011 |
| KR | 101255352 B1 | 4/2013 |

OTHER PUBLICATIONS

Park et al., Design of Optimal Wet-Season Injection Well for Augmenting Groundwater Resources in Coastal Areas, Journal of Korea Water Resources Association, May 2009, pp. 415-424, vol. 42, No. 5, English abstract.

International Search Report dated Aug. 18, 2017 for PCT/KR2017/000219, citing the above reference(s).

Korean Office Action for corresponding Korean Patent Application No. 10-2016-0151781 dated Aug. 11, 2018, citing the above reference(s).

* cited by examiner

NON-POWERED SEAWATER PUMPING SYSTEM FOR REDUCING SEAWATER INTRUSION, AND APPARATUS AND METHOD FOR OPTIMAL DESIGN OF WELL IN THE SAME SYSTEM

TECHNICAL FIELD

The present invention relates to a seawater pumping system for reducing influence of seawater intrusion, and an apparatus and method for optimal design of a well in the system, and more particularly, to a non-powered seawater pumping system for pumping seawater without a separate power source such as a pump, and an apparatus and method for optimal design of a seawater pumping apparatus for seawater pumping at optimal efficiency in the seawater pumping system.

BACKGROUND ART

In general, seawater frequently intrudes through a permeable layer in a land to pollute underground water in a coastal area. In particular, when excess of an available amount of underground water is used in a corresponding area, a groundwater level is lowered and seawater more smoothly intrudes and, when seawater intrudes into an aquifer in a land, water quality of the aquifer may not be recovered for several years, resulting in loss in value as a water intake source.

Conventionally, as a method of preventing or reducing seawater intrusion, a method of pumping seawater at a lower portion of a seawater-fresh water boundary surface or injecting fresh water into an aquifer is used. However, both the methods of pumping seawater and injecting fresh water require a driving source such as a pump and require power for driving the driving source and, thus, there is a problem in terms of high installment and maintenance costs.

DETAILED DESCRIPTION

Technical Object

An exemplary embodiment of the present invention provides a seawater pumping apparatus that pumps seawater according to the siphon principle based on a difference between a seawater level and an underground water level and, thus, a non-powered seawater pumping apparatus that has a simple well structure and does not require a separate pump or power device may be embodied, thereby reducing installment cost and time and remarkably reducing maintenance cost.

An exemplary embodiment of the present invention provides a hydraulic model device that simulates the natural phenomenon in which ebb tide and high tide are repeated and also accurately measures the amount of pumped water when seawater is pumped at a water level during ebb tide.

An exemplary embodiment of the present invention provides a method for optimal design of a seawater pumping apparatus, for most effectively pumping seawater under a given condition.

Technical Solving Method

According to an exemplary embodiment, there is provided a non-powered seawater pumping apparatus for reducing seawater intrusion in a land in which an aquifer with a seawater-fresh water boundary surface is formed, the apparatus including a pumping pipe having opposite open end portions, a first end portion of the opposite open end portions being positioned below a sea level and a second end portion being positioned below a seawater-fresh water boundary surface in the land, and a well disposed to surround a lateral surface of a land-buried portion of the pumping pipe, which is buried in the land, so as to space away the land-buried portion of the pipe from the land, wherein seawater is filled in the pumping pipe, and the well includes a screen having a plurality of through holes formed along a circumference of the well at a lower end portion of the well.

According to an exemplary embodiment, there is provided a hydraulic model device for simulation of a boundary surface of first fluid and second fluid with smaller specific gravity than the first fluid, the device including a water tank including a sand reservoir configured to at least partially accommodate sand and a first fluid reservoir and a second fluid reservoir, which are disposed at opposite sides of the sand reservoir and configured to store the first fluid and the second fluid, respectively, a first screen interposed between the sand reservoir and the first fluid reservoir and having a plurality of through holes formed therein, a second screen interposed between the sand reservoir and the second fluid reservoir and having a plurality of through holes formed therein, a discharged water reservoir configured to store the first fluid discharged from the water tank, a first water level adjustment device configured to adjust a water level of the first fluid reservoir, and a second water level adjustment device configured to adjust a water level of the discharged water reservoir at the same level as a water level of the first fluid reservoir.

According to an exemplary embodiment, there is provided a method of designing an optimized seawater pumping apparatus using a computer in a system in which the seawater pumping apparatus is installed to reduce seawater intrusion in a land in which an aquifer with a seawater-fresh water boundary surface is formed, the method including (a) applying an optimization algorithm to initial condition data of the aquifer to generate n (n is an integer equal to or greater than 2) decision variable sets D of the seawater pumping apparatus, (b) applying an underground water flow model to each of the n decision variable sets D to generate n prediction results of change in a boundary surface, (c) calculating a performance evaluation value of each of the n prediction results, and (d) selecting a decision variable set D having a maximum performance evaluation value.

According to an exemplary embodiment, there is provided a computer readable recording medium having recorded thereon a program for executing the method.

Advantageous Effects

According to one or more embodiments of the present invention, a seawater pumping apparatus may pump seawater according to the siphon principle based on a difference between a seawater level and an underground water level and, thus, a non-powered seawater pumping apparatus that has a simple well structure and does not require a separate pump or power device may be embodied, thereby reducing installment cost and time and remarkably reducing maintenance cost.

According to one or more embodiments of the present invention, a hydraulic model device may simulate the natural phenomenon in which ebb tide and high tide are repeated and may also accurately measures the amount of pumped water when seawater is pumped at a water level during ebb tide.

According to one or more embodiments of the present invention, a method for optimal design of a seawater pumping apparatus may most effectively pump seawater under a given condition.

BEST MODE FOR EMBODYING THE INVENTION

Figure 1:
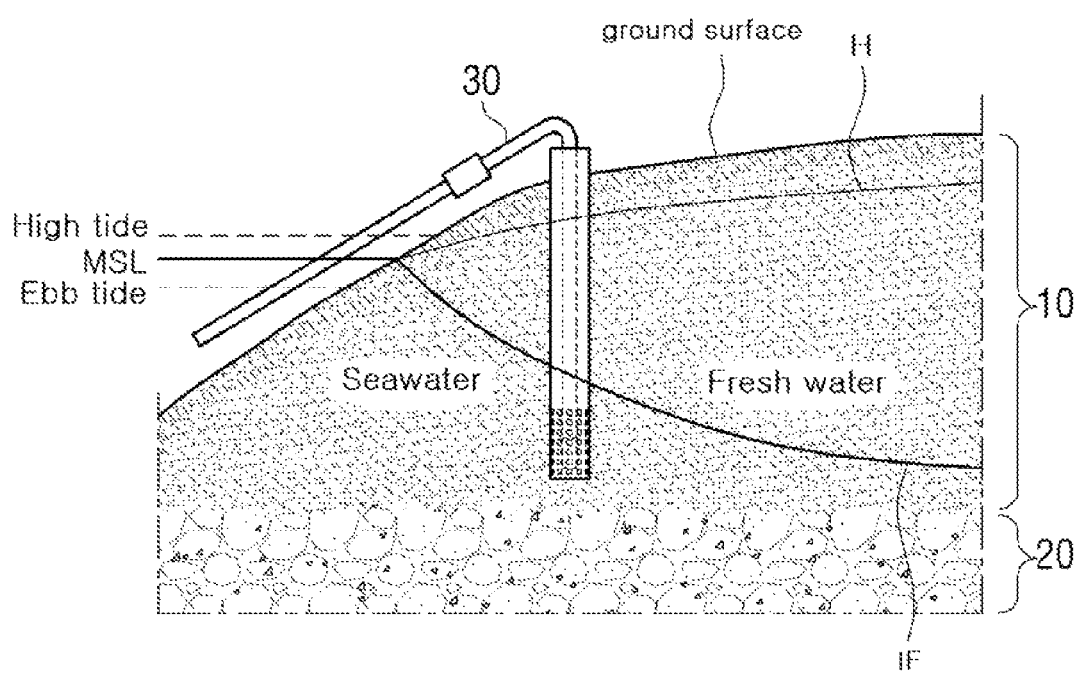
FIG. 1 is a diagram for explanation of a seawater pumping system according to an exemplary embodiment of the present invention.

Exemplary embodiments will now be described more fully with reference to the accompanying drawings to clarify aspects, other aspects, features and advantages of the present invention. The exemplary embodiments may, however, be embodied in many different forms and should not be construed as limited to the exemplary embodiments set forth herein. Rather, the exemplary embodiments are provided so that this disclosure will be thorough and complete, and will fully convey the scope of the application to those of ordinary skill in the art.

In the drawings, the lengths, thicknesses, and areas of elements are exaggerated for effective explanation.

As used herein, the singular forms are intended to include the plural forms as well, unless the context clearly indicates otherwise. It will be further understood that the terms "comprises" and/or "comprising," when used in this specification, do not preclude the presence or addition of one or more other components.

Hereinafter, exemplary embodiments will be described in greater detail with reference to the accompanying drawings. The matters defined in the description, such as detailed construction and elements, are provided to assist in a comprehensive understanding of the exemplary embodiments. However, it is apparent that the exemplary embodiments can be carried out by those of ordinary skill in the art without those specifically defined matters. In the description of the exemplary embodiments, certain detailed explanations of the related art are omitted when it is deemed that they may unnecessarily obscure the essence of the present invention.

Hereinafter, a seawater pumping system according to an exemplary embodiment of the present invention will be described with reference to FIGS. 1 to 4.

FIG. 1 is a schematic cross-sectional view of a land of a coastal area and a seawater pumping system installed in this area, according to an exemplary embodiment of the present invention. Referring to the drawing, the land may broadly include a permeable layer 10 and an aquiclude 20 downward from a ground surface. The permeable layer 10 may include an overburden, a soil layer, and so on through which water is capable of permeating or easily permeates and the aquiclude 20 may include a clay layer, a rock layer, and so on through which water is not capable of permeating or is difficult to permeate.

An aquifer containing underground water (fresh water) is present in a region of the permeable layer 10 of an inland area. The aquifer may include soil components with high hydraulic conductivity and, in general, include various rock components such as sand, gravel, sandstone, an alluvial layer, porous limestone, crack marble, crack granite, and clastic quartzite.

However, as illustrated in FIG. 1, in a coastal area, seawater intrudes into an inland area through the permeable layer 10 and, in this regard, specific gravity (about 1.025) of seawater is greater than specific gravity of fresh water and, thus, seawater intrudes below fresh water and a seawater-fresh water boundary surface IF may be generated. As illustrated in FIG. 1, distribution of a water level of the seawater-fresh water boundary surface IF (hereinafter, referred to as "boundary surface") is shown as being the same as a water level of the sea in a coastline and being lowered toward an inland area.

A seawater pumping apparatus 30 for pumping seawater to reduce seawater intrusion according to an exemplary embodiment of the present invention may be installed on this land. In this regard, FIG. 2 is a schematic diagram of a seawater pumping apparatus according to an exemplary embodiment of the present invention.

Figure 2:
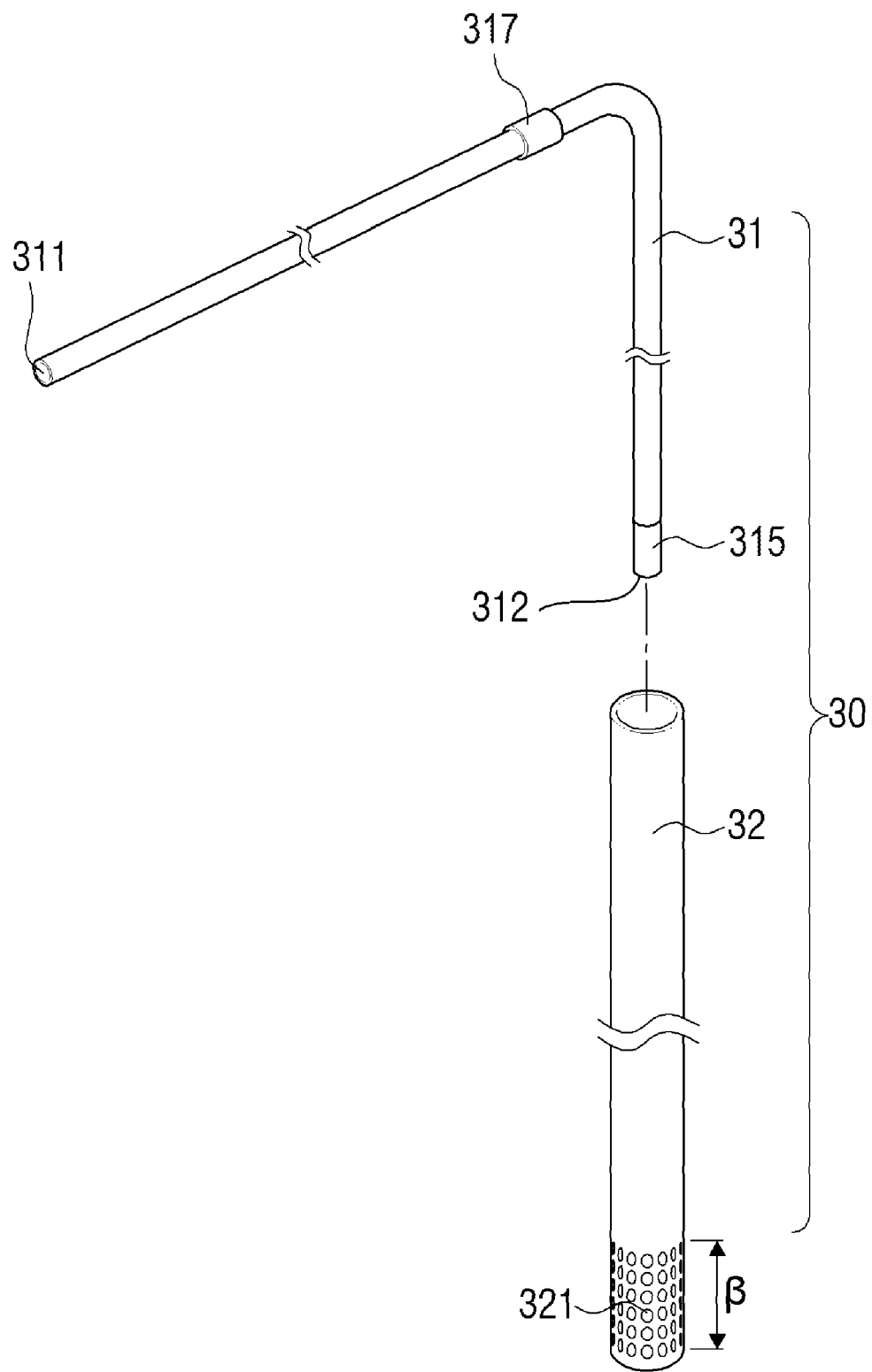
FIG. 2 is a diagram for explanation of a seawater pumping apparatus according to an exemplary embodiment of the present invention.

Referring to FIG. 2, the seawater pumping apparatus 30 according to an exemplary embodiment of the present invention may include a pumping pipe 31 for discharging, to the sea, seawater that intrudes into a permeable layer of an inland area and a well 32 formed to surround a portion of the pumping pipe 31.

The pumping pipe 31 (hereinafter, referred to "pipe") may be formed as a long pipe including opposite open end portions 311 and 312. As illustrated in FIG. 1, the pumping pipe 31 may be disposed so as to position a first end portion 311 of the opposite end portions below a sea level and to position a second end portion 312 below a seawater-fresh water boundary surface in the land. Although described later, seawater is filled in the pipe 31 and is pumped toward the first end portion 311 from the second end portion 312 according to the siphon principle.

In order to fill seawater in the pipe 31, although not shown, for example, one or more openable inlets (not shown) may be formed in the pipe 31 and seawater may be injected into the pipe 31 through the inlet.

According to an exemplary embodiment of the present invention, the pipe 31 may include a check valve 315. The check valve 315 may not affect seawater flow toward the first end portion 311 from the second end portion 312 but may prevent seawater from flowing backward in an opposite direction, that is, a direction toward the second end portion 312 from the first end portion 311. In the illustrated embodiment, although the check valve 315 is illustrated as installed at the second end portion 312 of the pipe 31, the check valve 315 may be installed at an arbitrary location of the pipe 31.

According to an exemplary embodiment of the present invention, the pipe 31 may further include a flow meter 317. The flow meter 317 may measure the amount of fluid flowing in the pipe 31 and may be installed at an arbitrary location of the pipe 31.

According to an exemplary embodiment of the present invention, the well 32 may be shaped like, for example, a long cylindrical pipe and a portion of the pipe 31 may be installed into the well 32. That is, the well 32 may be disposed to surround a 'portion' (hereinafter, "land-buried portion") of the pipe 31, which is buried in the land, so as to space away the land-buried portion of the pipe 31 from the land. Accordingly, an internal diameter of the well 32 may be greater than an external diameter of the land-buried portion of the pipe 31.

An upper end portion of the well 32 may be opened to permit the pipe 31 to be inserted thereinto and a lower end portion of the well 32 may be opened or closed by a lower bottom.

A plurality of through holes 321 may be formed along a circumference of the well 32 at a lower end portion of the well 32. The through hole 321 may be formed up to a predetermined height 13 to surround the lower end portion of the well 32 and, as such, a region in which the through holes 321 are formed is referred to as a 'screen'.

The through hole 321 may have an appropriate diameter as long as fluid (e.g., seawater or fresh water) flows therethrough and soil of an aquifer does not pass through the through hole 321 and, accordingly, seawater flows into a space between an external lateral surface of the pipe 31 and an internal lateral surface of the well 32 and is filled in at least a portion of the space. For example, seawater that flows into the space through the through holes 321 may be filled up to a groundwater level H.

Figure 3:
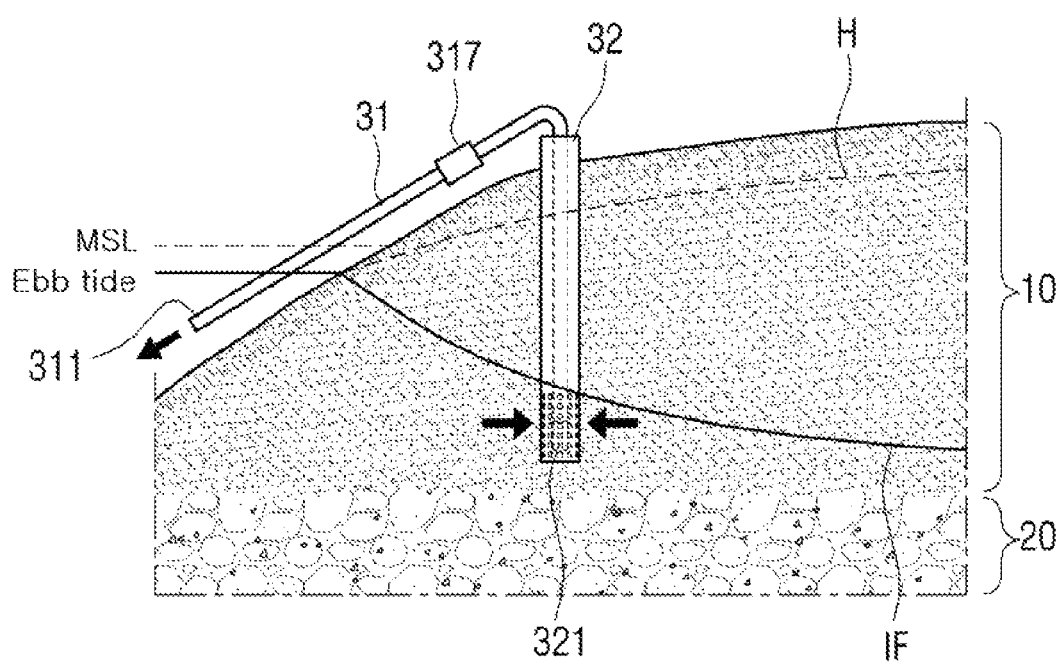
FIG. 3 is a diagram for explanation of an operation of a seawater pumping apparatus at a water level during ebb tide, according to an exemplary embodiment of the present invention.

FIG. 3 is a diagram for explanation of an operation of a seawater pumping apparatus at a water level during ebb tide, according to an exemplary embodiment of the present invention. Referring to the drawing, a seawater level further drops below a mean seawater level (MSL) during ebb tide. However, the well 32 is maintained at a higher water level than a seawater level according to flow of underground water that flows to a coastal area from an inland area and, thus, water in the pipe 31 flows toward the first end portion 311 from the second end portion 312 according to the siphon principle and seawater below the seawater-fresh water boundary surface IF is pumped to the sea.

Figure 4:
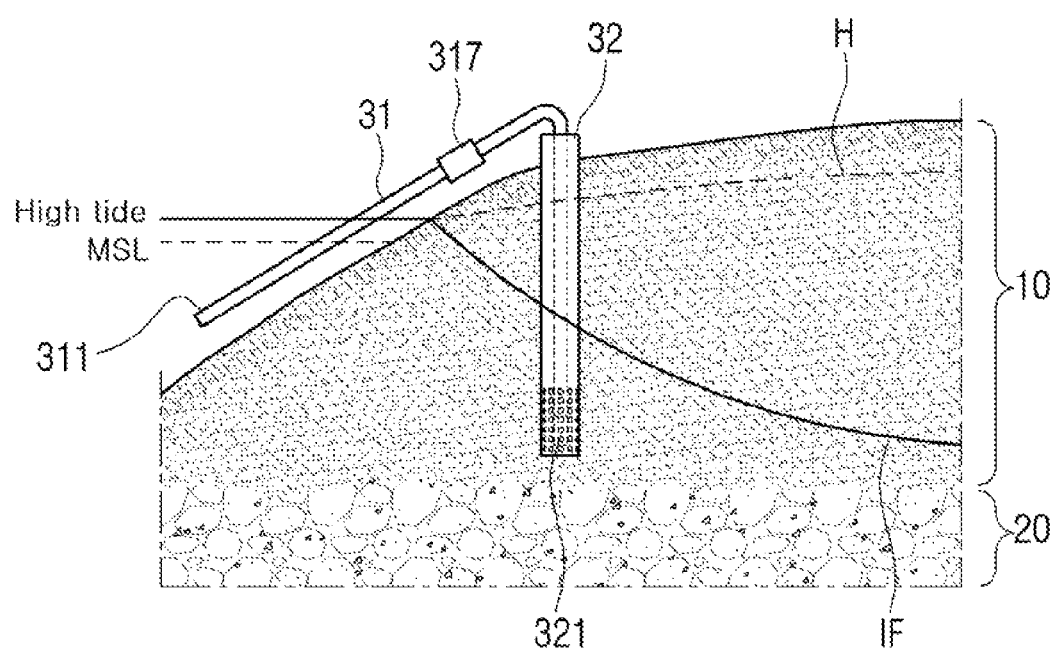
FIG. 4 is a diagram for explanation of an operation of a seawater pumping apparatus at a water level during high tide, according to an exemplary embodiment of the present invention.

FIG. 4 is a diagram for explanation of an operation of a seawater pumping apparatus at a water level during high tide, according to an exemplary embodiment of the present invention. Referring to the drawing, a seawater level further rises above a mean seawater level (MSL) during high tide. Accordingly, a difference between a seawater level and a water level of a well is reduced and the amount of seawater flowing toward the sea through the pipe 31 may be reduced.

In this case, when the groundwater level H is lower than a seawater level, seawater flows into the first end portion 311 according to the siphon principle and flows backward in a direction toward the second end portion 312. Accordingly, according to an exemplary embodiment of the present invention, the check valve 315 may operate to prevent seawater from flowing backward. According to an alternative embodiment of the present invention, a manual or automatic open/close valve may be installed instead of the check valve 315 so as to prevent seawater from flowing backward.

Figure 5:
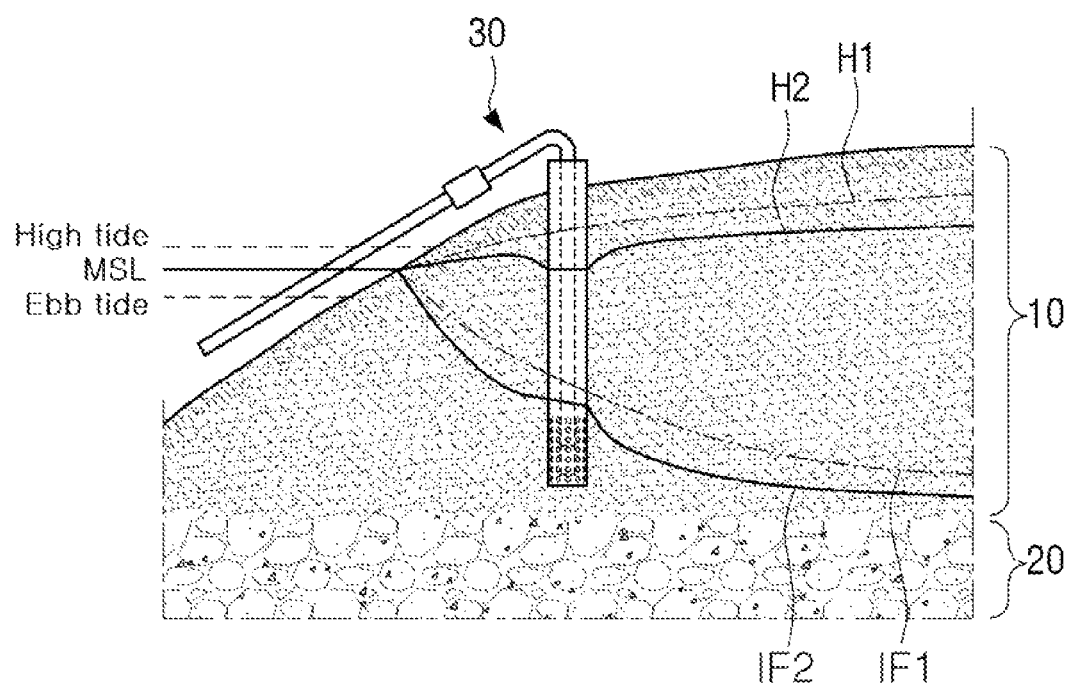
FIG. 5 is a diagram for explanation of change in groundwater level and seawater-fresh water boundary surface through an operation of a seawater pumping apparatus according to an exemplary embodiment of the present invention.

FIG. 5 is a diagram for explanation of change in groundwater level and seawater-fresh water boundary surface through an operation of a seawater pumping apparatus according to an exemplary embodiment of the present invention and, for example, schematically illustrates assuming a steady state after an operation of pumping seawater at a water level during ebb tide and temporary stopping of seawater pumping at a water level during high tide are continuously repeated and a time elapses.

Referring to the drawing, the groundwater level H is at a level H1 prior to water pumping and drops to a level H2 after water pumping. The seawater-fresh water boundary surface IF is at a level IF1 prior to water pumping and drops to IF2 after water pumping. Drop in the level of the boundary surface IF means that a fresh water region is correspondingly widened and, thus, it may be seen that seawater intrusion is reduced.

As such, the seawater pumping apparatus 30 according to an exemplary embodiment of the present invention pumps seawater according to the siphon principle based on a difference between a seawater level and an underground water level during ebb tide and, thus, a non-powered seawater pumping apparatus that does not require a separate pump or power device may be embodied, thereby reducing installment cost and time and remarkably reducing maintenance cost compared with a conventional seawater pumping apparatus via pump driving.

According to the aforementioned exemplary embodiment of the present invention, the amount of pumped seawater is small or seawater is not capable of being pumped during high tide but, in an alternative embodiment, a pump (not shown) may be further installed to compensate the defect. That is, as illustrated in FIG. 3, seawater is pumped without power according to the siphon principle during ebb tide and the pump is driven to assist seawater pumping according to the present invention during high tide and, thus, seawater may be pumped for 24 hours irrespective of a difference between ebb tide and high tide. According to the alternative embodiment of the present invention, additional components (e.g., a pump and a power source) are installed at high cost compared with the illustrated embodiment, but the pump is driven during half or less of a total operating time and, thus, a cost saving effect may be still maintained compared with the prior art.

When the aforementioned non-powered seawater pumping system is used, pumping efficiency may be varied according to a location of an aquifer, at which the seawater pumping apparatus 30 is buried, the seawater pumping apparatus 30 may be installed at a most optimum location if possible. To this end, a pumping well may be designed in overall consideration of influence of seawater pumping according to various design values of a pumping well, which will be described below with reference to FIGS. 11 to 14.

Hereinafter, with reference to FIGS. 6 to 10, a hydraulic model for simulation of a seawater-fresh water boundary surface for optimal design of the aforementioned seawater pumping apparatus 30 will be described.

Figure 6:
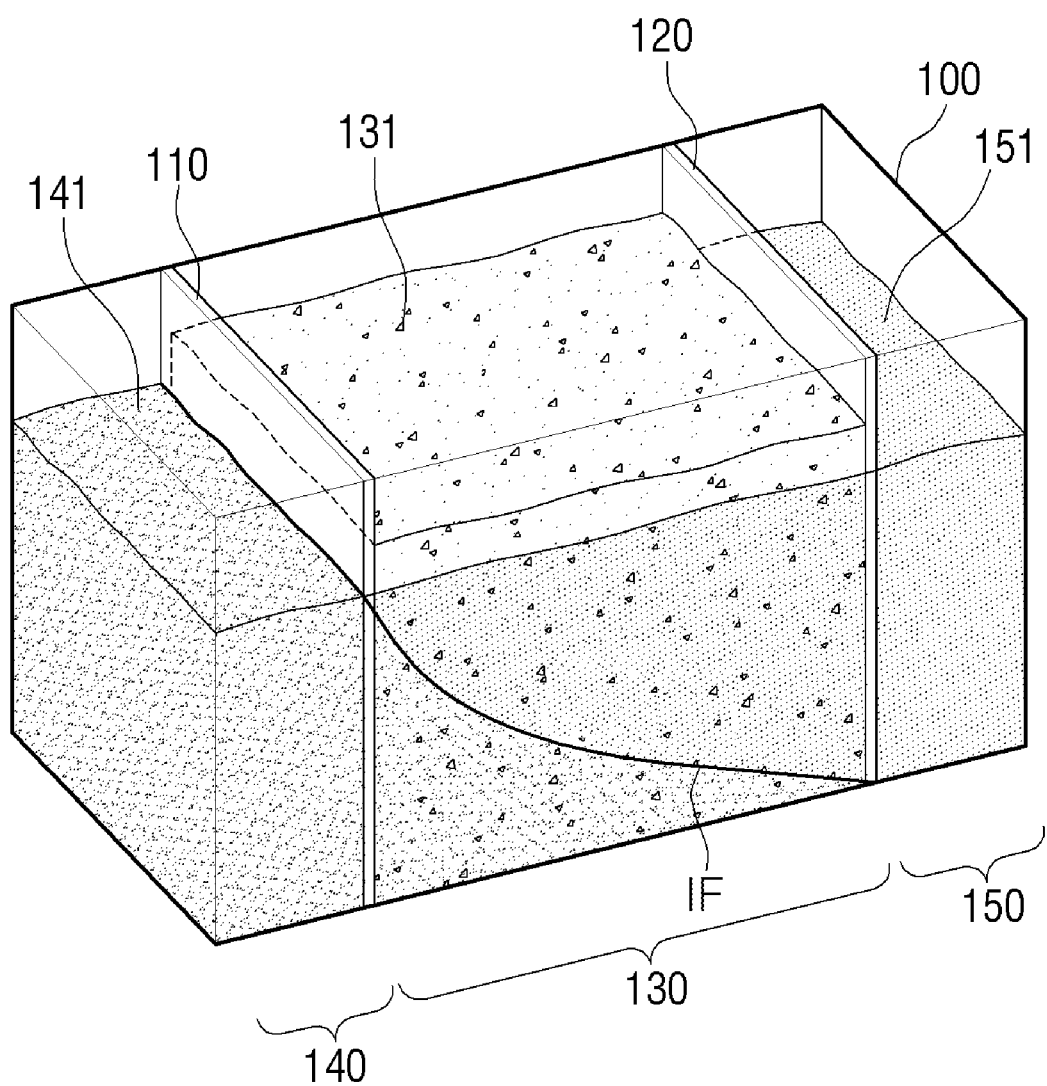
FIG. 6 is a schematic perspective diagram of a hydraulic model device for simulation of a seawater-fresh water boundary surface according to an exemplary embodiment of the present invention.
Figure 7:
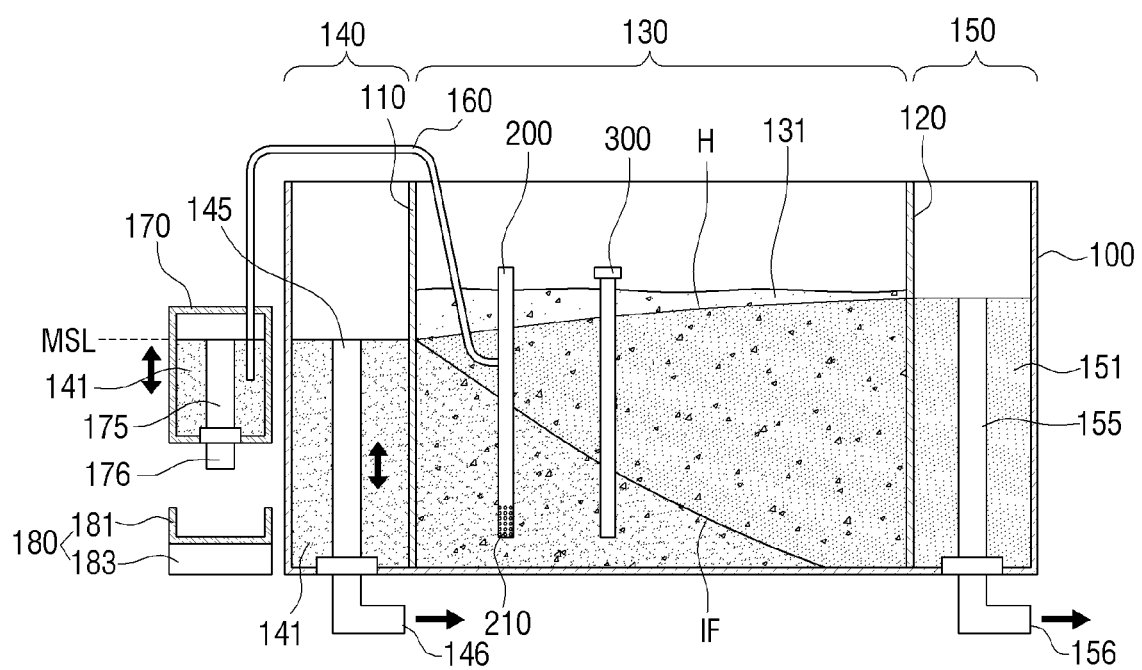
FIG. 7 is a diagram for explanation of a hydraulic model device according to an exemplary embodiment of the present invention.

FIG. 6 is a schematic perspective diagram of a hydraulic model device for simulation of a seawater-fresh water boundary surface according to an exemplary embodiment of the present invention. FIG. 7 is a lateral cross-sectional view of a hydraulic model device according to an exemplary embodiment of the present invention. In FIG. 6, some components are omitted to facilitate understanding of a structure of a hydraulic model device.

Referring to the drawing, the hydraulic model device according to an exemplary embodiment of the present invention may include a water tank 100. The water tank 100 may be shaped like a hexagon with an open upper end portion and may be formed of a transparent or semitransparent material such that the inside of the water tank 100 is seen.

The internal portion of the water tank 100 may be divided into at least three portions. In the illustrated embodiment, a sand reservoir 130 for accommodating sand 131 may be positioned in an intermediate portion and a seawater reservoir 140 for storing seawater and a fresh water reservoir 150 for storing fresh water may be positioned at opposite sides, respectively.

The sand reservoir 130 and the seawater reservoir 140 may be separated by a first screen 110 and the sand reservoir 130 and the fresh water reservoir 150 may be separated by a second screen 120. Each of the first and second screens 110 and 120 may be shaped like, for example, a thin plate and a plurality of through holes (not shown) may be formed over an entire area of a screen. The through hole may have an appropriate size as long as sand does not pass the through hole but fluid (seawater and fresh water) flows through the through hole.

Accordingly, when sand 131 is put in the sand reservoir 130 and, then, seawater 141 and fresh water 151 are filled up to predetermined water levels in the seawater reservoir 140 and the fresh water reservoir 150, respectively, the seawater 141 and the fresh water 151 partially intrude into the sand reservoir 130 through the first screen 110 and the second screen 120, respectively. In this case, since specific gravity of seawater is greater than that of fresh water, seawater intrudes below fresh water and a seawater-fresh water boundary surface IF is formed, as illustrated in FIG. 6.

Referring to FIG. 7, a water level adjustment device for adjusting a water level may be installed in the seawater reservoir 140. In the illustrated embodiment, the water level adjustment device may include a drainage pipe 145. The drainage pipe 145 may be disposed in an upper and lower direction in the seawater reservoir 140 and may have an upper end portion opened upward and a lower end portion 146 that is connected to the outside through the seawater reservoir 140. In this configuration, when a water level of seawater becomes higher than the upper end portion of the drainage pipe 145, seawater is suck into the drainage pipe 145 and discharged to the outside through the lower end portion 146 and, thus, seawater may be maintained at a height of the upper end portion of the drainage pipe 145.

In this case, according to an exemplary embodiment of the present invention, the drainage pipe 145 may be configured to be moved in an upper and lower direction. Although not illustrated, for example, the drainage pipe 145 may be moved by a predetermined height in an upper and lower direction in the seawater reservoir 140 by a driver, for example, a driving motor or a cylinder and, accordingly, a seawater level of the seawater reservoir 140 may also rise or drop by the corresponding height. Accordingly, according to this configuration, for example, change in a seawater level during ebb tide-high tide may be embodied in a hydraulic model device according to the present invention.

According to an exemplary embodiment of the present invention, a water level adjustment device for adjustment of a water level may also be installed in the fresh water reservoir 150. According to an exemplary embodiment of the present invention, the water level adjustment device may include a drainage pipe 155. Similarly to the drainage pipe 145 of the seawater reservoir 140, the drainage pipe 155 of the fresh water reservoir 150 may be disposed in an upper and lower direction in the fresh water reservoir 150 and may have an upper end portion that is opened upward and a lower end portion 156 that is connected to the outside through the fresh water reservoir 150. Accordingly, when a water level of fresh water becomes higher than the upper end portion of the drainage pipe 155, fresh water is discharged to the outside through the drainage pipe 155 and, thus, fresh water of the fresh water reservoir 150 may be maintained at a height of the upper end portion of the drainage pipe 155.

In this case, according to an exemplary embodiment of the present invention, similarly to the drainage pipe 145 of the seawater reservoir 140, the drainage pipe 155 of the fresh water reservoir 150 may also be configured to be moved in an upper and lower direction. However, it may not be necessary to consider a difference between ebb tide and high tide with respect to fresh water and, accordingly, a device for driving the drainage pipe 155 in an upper and lower direction may be omitted.

In the illustrated embodiment, although the drainage pipes 145 and 155 are used to adjust water levels of the seawater reservoir 140 and the fresh water reservoir 150, respectively, other methods may be used instead of the drainage pipes 145 and 155. For example, a pump may also be installed in each of the reservoirs 140 and 150 and driven to adjust each of the reservoirs 140 and 150 to a desired water level and, accordingly, it would be obvious to one of ordinary skilled in the art that the present invention is not limited to a specific water level adjustment device.

The hydraulic model device according to an exemplary embodiment of the present invention may further include a discharged water reservoir 170 for storing seawater discharged from the water tank 100. The discharged water reservoir 170 may be any-type container as long as the discharged water reservoir 170 contains fluid.

The discharged water reservoir 170 may include a water level adjustment device for adjustment of a water level. According to an exemplary embodiment of the present invention, the water level adjustment device may include a drainage pipe 175. Similarly to the drainage pipes 145 and 155 of the seawater reservoir 140 or the fresh water reservoir 150, the drainage pipe 175 of the discharged water reservoir 170 may be disposed in an upper and lower direction in the discharged water reservoir 170 and may have an upper end portion that is opened upward and a lower end portion 176 that is connected to the outside through the discharged water reservoir 170. Accordingly, when a water level of discharged water becomes higher than the upper end portion of the drainage pipe 175, discharged water is discharged to the outside through the drainage pipe 175 and, thus, water in the discharged water reservoir 170 may be maintained at a height of the upper end portion of the drainage pipe 175.

According to an exemplary embodiment of the present invention, a water level of the discharged water reservoir 170 may be maintained at the same water level of that of the seawater reservoir 140. To this end, according to an exemplary embodiment of the present invention, the drainage pipe 175 of the discharged water reservoir 170 may be designed to have an upper end portion with the same height as that of the upper end portion of the drainage pipe 145 of the seawater reservoir 140. In addition, when the drainage pipe 145 is moved in an upper and lower direction, the discharged water reservoir 170 may be configured to be correspondingly moved in an upper and lower direction. For example, the discharged water reservoir 170 and the drainage pipe 145 may be configured to be integrally and simultaneously moved in an upper and lower direction using one driving motor or driving cylinder.

As an alternative method of maintaining a water level of the discharged water reservoir 170 at the same water level as that of the seawater reservoir 140, the drainage pipe 175 of the discharged water reservoir 170 may be designed to have the upper end portion with the same height as that of the upper end portion of the drainage pipe 145 of the seawater reservoir 140 and the two drainage pipes 145 and 175 may be configured to be integrally moved in an upper and lower direction. That is, in the alternative embodiment, the discharged water reservoir 170 may be fixed and only the drainage pipe 175 may be configured to be moved in an upper and lower direction according to movement of the drainage pipe 145.

A discharge amount measurer 180 for measuring the amount of water discharged from the discharged water reservoir 170 may be disposed below the discharged water reservoir 170. In the illustrated embodiment, the lower end portion of the drainage pipe 175 of the discharged water reservoir 170 may be configured to be opened downward such that water discharged from the discharged water reservoir 170 directly drops into the discharge amount measurer 180.

According to an exemplary embodiment of the present invention, the discharge amount measurer 180 may include a container 181 for accommodating water that drops from the discharged water reservoir 170 and a scale 183 for measuring a weight of the container. The container 181 may be any-type container for accommodating water discharged from the discharged water reservoir 170 and the scale 183 may be, for example, an electronic scale.

The hydraulic model device according to an exemplary embodiment of the present invention may include a pipe 200 that is buried in an upper and lower direction in the sand reservoir 130. The pipe 200 may have opposite open end portions and a screen may be formed to a predetermined height at the lower end portion. A plurality of through holes 210 may be formed in the screen and the through hole 210 may have an appropriate diameter as long as sands do not pass through the through hole 210 but fluid passes through the through hole 210.

The lower portion of the pipe 200 extends below the seawater-fresh water boundary surface such that the screen is disposed below the boundary surface. According to this configuration, seawater flowing into the pipe 200 through the through hole 210 of the screen may be filled up to a predetermined height in the pipe 200. For example, seawater flowing into the pipe 200 may be filled to almost the same height as that of fresh water that intrudes into the sand reservoir 130.

A hose 160 may be installed to allow fluid to flow between an internal portion of the pipe 200 and the discharged water reservoir 170. The hose 160 may be installed in such a way that one end portion of the hose 160 is positioned below a water level of the discharged water reservoir 170 and the other end portion is connected to an approximate intermediate portion of the pipe 200 to be connected to the internal portion of the pipe 200. In this case, the other end portion of the hose 160 may be connected to the pipe 200 at a lower location than a water level of the pipe 200 and the internal portion of the hose 160 may be entirely filled with seawater in order to discharge seawater of the water tank 100 to the discharged water reservoir 170 according to the siphon principle.

As necessary, in order to measure the height of the seawater-fresh water boundary surface, one or more boundary surface measure devices 300 may be buried in the sand reservoir 130. The boundary surface measure device will be described below with reference to FIG. 10.

Figure 8:
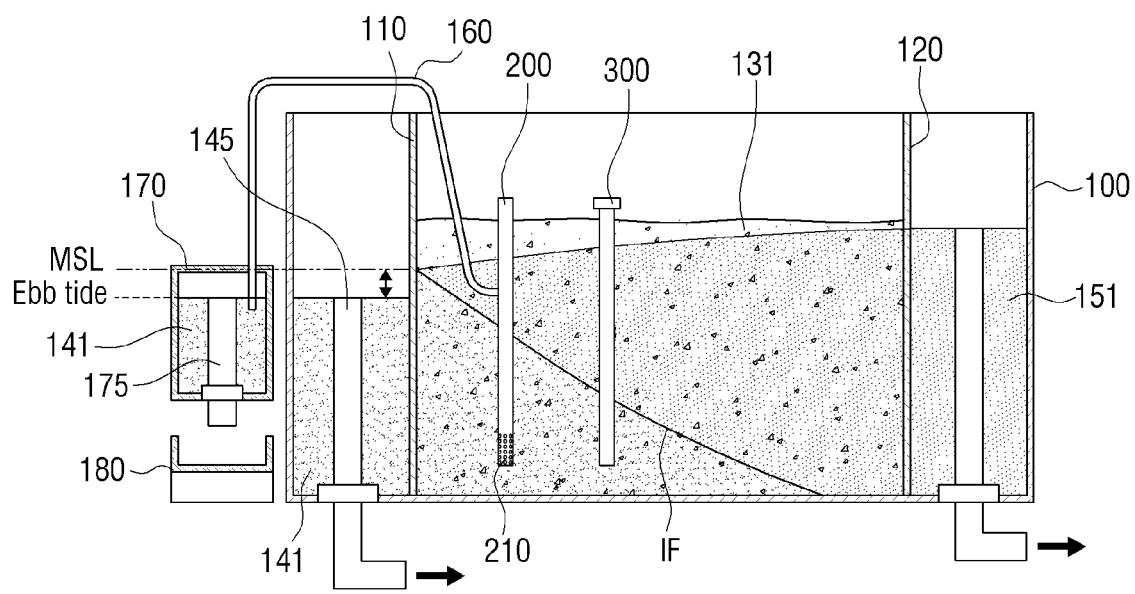
FIG. 8 is a diagram for explanation of an operation of a hydraulic model device at a water level during ebb tide, according to an exemplary embodiment of the present invention.
Figure 9:
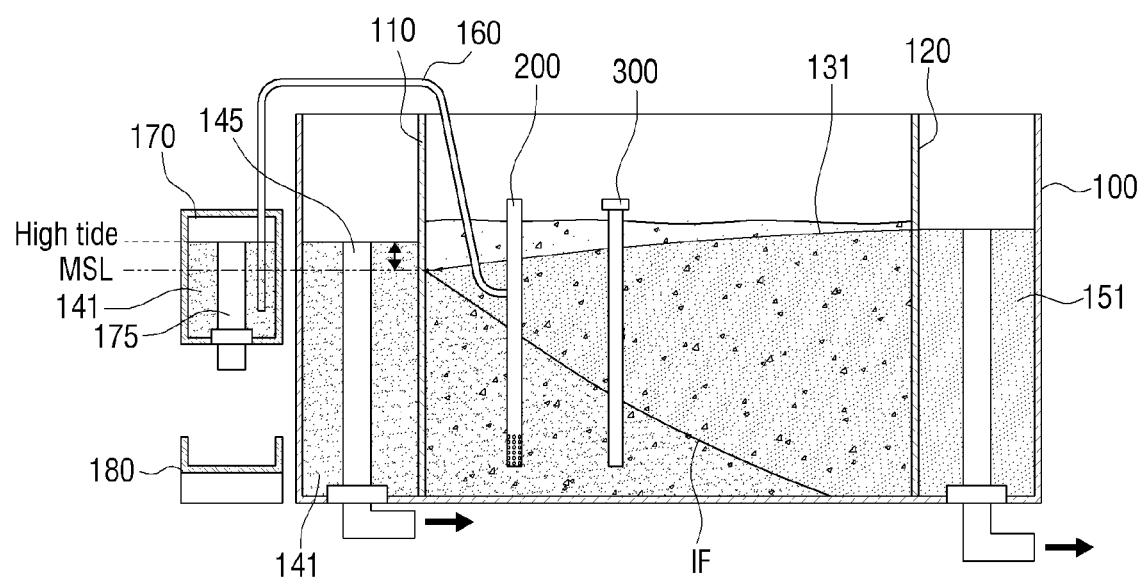
FIG. 9 is a diagram for explanation of an operation of a hydraulic model device at a water level during high tide according to an exemplary embodiment of the present invention.

With reference to FIGS. 8 and 9, how a hydraulic model device embodies ebb tide and high tide will be described below.

FIG. 8 is a diagram for explanation of an operation of a hydraulic model device at a water level during ebb tide, according to an exemplary embodiment of the present invention.

First, as illustrated in FIG. 7, a state in which the fresh water reservoir 150 is maintained at a slightly higher water level than that of the seawater reservoir 140 may be assumed to simulate a mean seawater level (MSL). In this state, the drainage pipe 145 of the seawater reservoir 140 may be moved downward by a predetermined height. In this case, the discharged water reservoir 170 may be moved together by the same height and, accordingly, as illustrated in FIG. 8, a water level of the seawater reservoir 140 and a water level of the discharged water reservoir 170 may drop.

As such, water levels of the seawater reservoir 140 and the discharged water reservoir 170 are lower than a groundwater level (water levels of the sand reservoir 130 and the fresh water reservoir 150 in the illustrated hydraulic model) due to fresh water and, thus, seawater below the boundary surface in the water tank 100 may flow into the discharged water reservoir 170 according to the siphon principle. That is, seawater below the boundary surface may be discharged to the discharged water reservoir 170 through the pipe 200 and the hose 160.

In this case, seawater is already filled in the discharged water reservoir 170 up to the height of the upper end portion of the drainage pipe 175 and, thus, as seawater is discharged to the discharged water reservoir 170 from the water tank 100, water in the discharged water reservoir 170 flows over the drainage pipe 175 and drops into the container 181 of the discharge amount measurer 180. That is, the same amount of water as that of water discharged to the discharged water reservoir 170 from the water tank 100 may be discharged to the container 181. Accordingly, when the amount of water that drops into the container 181 is measured, the amount of seawater pumped according to the siphon principle among seawater below a boundary surface of the water tank 100 may be measured.

FIG. 9 is a diagram for explanation of an operation of a hydraulic model device at a water level during high tide according to an exemplary embodiment of the present invention. In order to simulate a high tide state by the hydraulic model device, as illustrated in FIG. 9, the drainage pipe 145 of the seawater reservoir 140 may be moved upward by a predetermined height. In this case, the discharged water reservoir 170 may be moved together by the same height and, accordingly, as illustrated in FIG. 9, a water level of the seawater reservoir 140 and a water level of the discharged water reservoir 170 may rise.

In this case, water levels of the seawater reservoir 140 and the discharged water reservoir 170 become higher than a groundwater level due to fresh water and, thus, seawater below the boundary surface in the water tank 100 may not flow to the discharged water reservoir 170 and water of the discharged water reservoir 170 may flow backward to the water tank 100 according to the siphon principle. Accordingly, in order to prevent water from flowing backward, according to an exemplary embodiment of the present invention, an open/close valve (not shown) may be installed in the hose 160 to prevent water from flowing backward.

As such, the states of FIGS. 8 and 9 are continuously and repeatedly simulated using the hydraulic model device according to the present invention for a predetermined time period and, thus, repetition of ebb tide and high tide may be simulated by the hydraulic model device and, when seawater is pumped at a water level during ebb tide, the amount of pumped water may be accurately measured.

It would be obvious to one of ordinary skill in the art that the hydraulic model device according to the aforementioned embodiment of the present invention is applied to the case in which a behavior of a boundary surface between two fluids (i.e., an arbitrary first fluid and a second fluid with smaller specific gravity than the first fluid) with different specific gravities is tested as well as the case in which a behavior of a seawater-fresh water boundary surface is tested.

Figure 10:
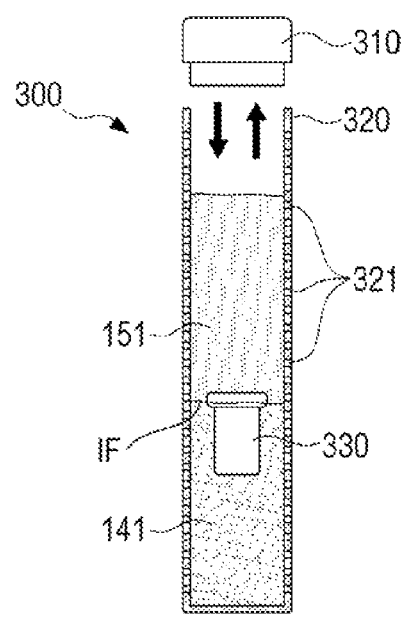
FIG. 10 is a diagram for explanation of a seawater-fresh water boundary surface measure device according to an exemplary embodiment of the present invention.

With reference to FIG. 10, the boundary surface measure device 300 will be described below. FIG. 10 is a schematic diagram illustrating an exemplary sectional structure of the seawater-fresh water boundary surface measure device 300 according to an exemplary embodiment of the present invention. The boundary surface measure device 300 may include a measurement pipe 320 filled with seawater or fresh water, a laser distance measurer 310 disposed at an upper end portion of the measurement pipe 320, and a buoy 330 positioned to freely move in the measurement pipe 320.

The measurement pipe 320 may be, for example, a cylindrical member to be buried in the sand reservoir 130 of the aforementioned hydraulic model device and may have an open upper end portion. The plurality of through holes 321 may be formed in a lateral surface of the measurement pipe 320 and may each have an appropriate diameter as long as fluid passes through the through holes 321 and sand does not pass through the through holes 321.

Accordingly, for example, as illustrated in FIGS. 7 to 9, when the measurement pipe 320 is buried in the sand reservoir 130, sand may not intrude into the measurement pipe 320 but seawater and fresh water may flow into the measurement pipe 320 and may be filled to a predetermined height. In this case, a seawater-fresh water boundary surface is generated in the sand reservoir 130 and, thus, a boundary surface IF may also be formed in the measurement pipe 320. That is, as illustrated in FIG. 10, the seawater 141 may intrude into a lower portion of the measurement pipe 320 and the fresh water 151 may intrude into an upper portion of the measurement pipe 320 to form a boundary surface IF, as illustrated in the drawing.

According to an exemplary embodiment of the present invention, the buoy 330 positioned in the measurement pipe 320 may be manufactured to have a specific gravity value between specific gravity of seawater and specific gravity of fresh water and, accordingly, the buoy 330 may be positioned at the boundary surface IF in the measurement pipe 320 filled with the seawater 141 and the fresh water 151.

For example, since specific gravity of fresh water is 1 and specific gravity of seawater is 1.025, the buoy 330 may be formed of a material with specific gravity of about 1.014. Alternatively, even if the material of the buoy 330 is heavier than seawater, a hollow is formed in the buoy 330 such that specific gravity of the buoy 330 is 1.014.

In the illustrated embodiment, the buoy 330 may be configured to have an upper surface that is approximately flat and is almost the same as the boundary surface IF.

In this state, the laser distance measurer 310 installed at the upper end portion of the measurement pipe 320 may measure a distance between the measurer and the buoy 330. For example, when a laser beam is emitted toward the buoy 330 from the laser distance measurer 310 and, then, is reflected by an upper surface of the buoy 330 back to the laser distance measurer 310, the laser distance measurer 310 may receive the reflected beam and measure a time difference between a time point of emitting light and a time point of receiving the reflected light to measure a distance between the laser distance measurer 310 and the buoy 330.

Hereinafter, with reference to FIGS. 11 to 14, a method of optimal design of a pumping well according to an exemplary embodiment of the present invention will be described.

When the non-powered seawater pumping system described with reference to FIGS. 1 to 5 is used, pumping efficiency may be varied according to a location of an aquifer, at which the pumping well 32 is buried, the pumping well 32 may be installed at a most optimum location if possible. To this end, a pumping well needs to be designed in overall consideration of influence of seawater pumping according to various design values of a pumping well.

Figure 11:
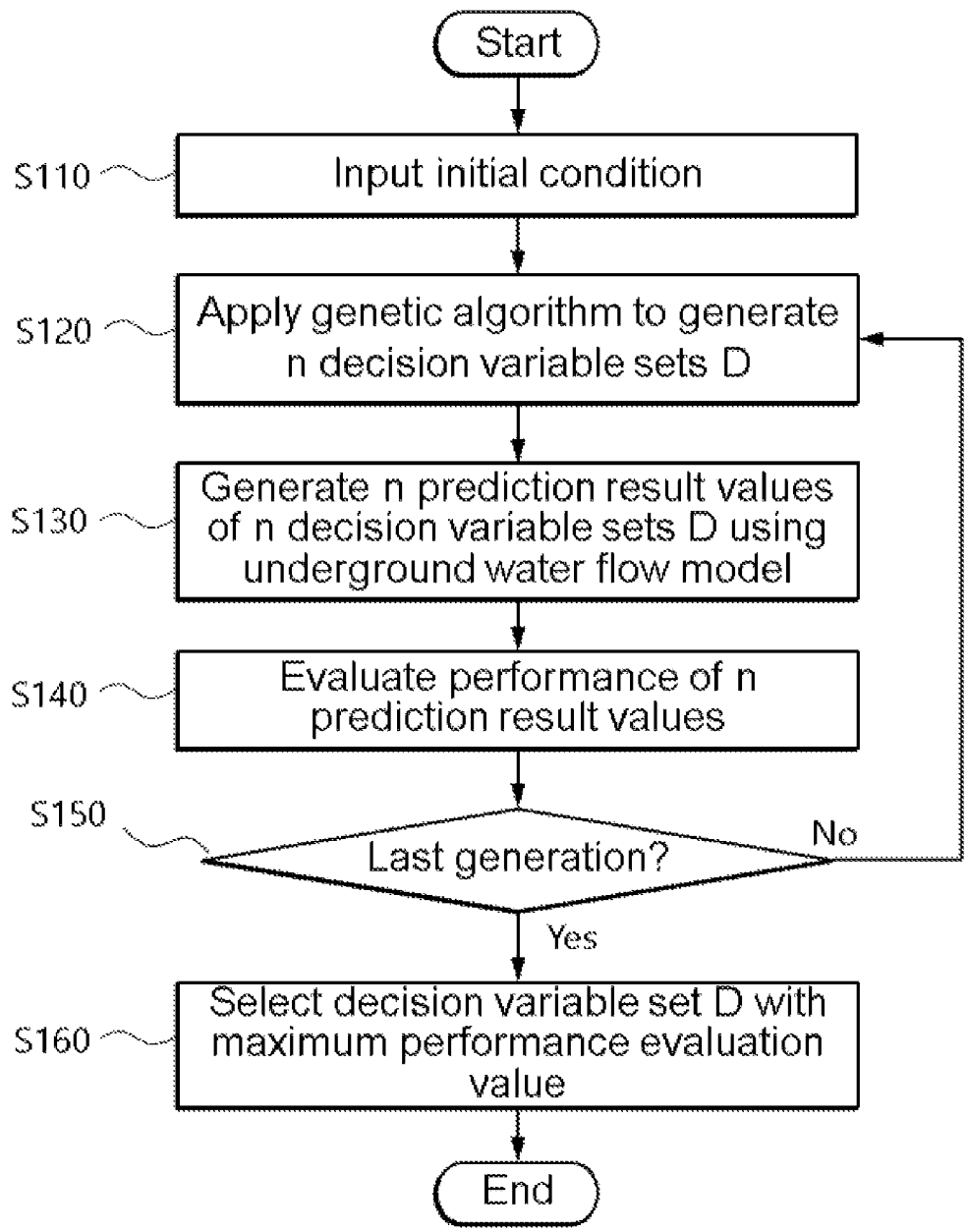
FIG. 11 is a flowchart of an example of a method for optimal design of a non-powered seawater pumping well according to an exemplary embodiment of the present invention.

FIG. 11 is a flowchart of an example of a method for optimal design of a non-powered seawater pumping well according to an exemplary embodiment of the present invention. First, in operation S110, initial condition data may be input to an optimization algorithm. Here, the initial condition data may be data to be input when the optimization algorithm is executed and, for example, may include data about distribution of a seawater-fresh water boundary surface and a groundwater level prior to non-powered seawater pumping in a target region.

Figure 12:
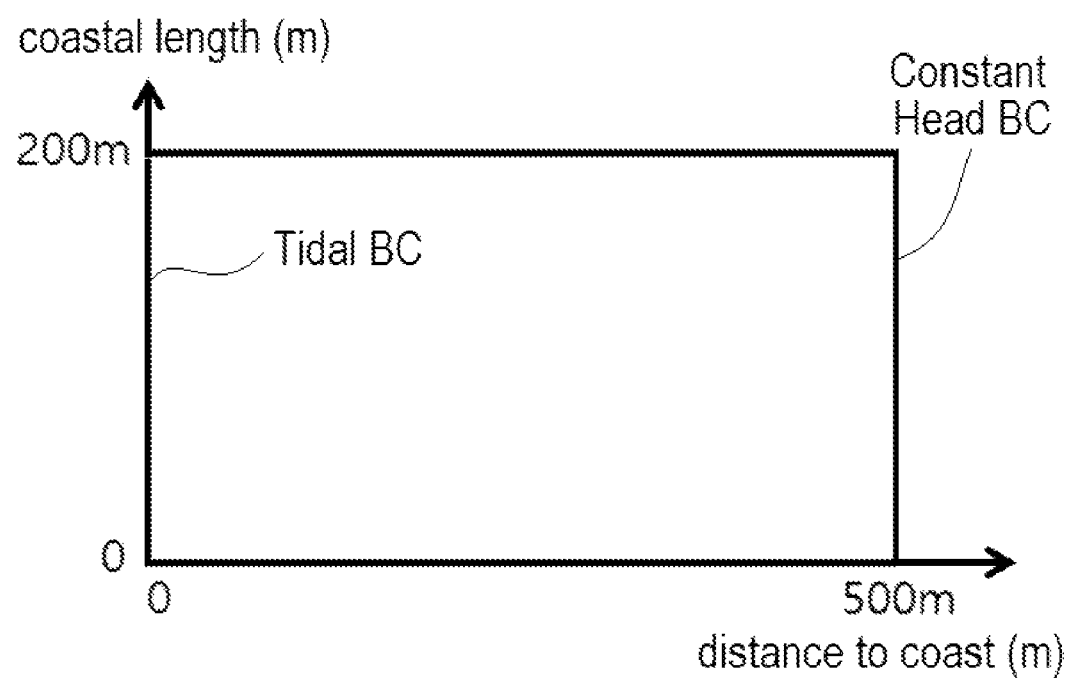
FIG. 12 is a diagram (top view) for explanation of an exemplary initial condition applied to a used optimization algorithm according to an exemplary embodiment of the present invention.

In this regard, FIG. 12 is a diagram for explanation for an exemplary initial condition. FIG. 12 is a plan view (top view) of an (unconfined) aquifer viewed from the above and contains a tidal boundary condition (BC) including a tide level function and a constant head BC indicating a predetermined water level condition of an inland area. According to an exemplary embodiment of the present invention, a tide level of ±3 m, a tide level interval of 12 hours, a predetermined water level of an inland area of 3 m, an aquifer depth of −30 m, and hydraulic conductivity of 0.5 m/day may be input as an initial condition. As illustrated in FIG. 12, the Y axis is input as a coastal length of 200 m and the X axis is set to 500 m as a distance to the Constant Head BC from the coast.

When the initial condition data is input to an optimization algorithm, in operation S120, the optimization algorithm may be applied to generate n (n is an integer equal to or greater than 2) decision variable sets D of the non-powered seawater pumping well. In this case, the "decision variable" may be a variable required to design the non-powered seawater pumping well 32 and may include at least one of a location a, a screen height 13, and a diameter γ of a pipe of the non-powered seawater pumping well 32 according to an exemplary embodiment of the present invention.

Here, the location a of the well 32 may be represented as a location on the plan view of FIG. 12 and, for example, a lower-left end portion of FIG. 12 may be the origin (0,0) and a point spaced apart from the origin by a predetermined distance in the X axis and Y axis directions may be represented as (x, y). The screen height 13 refers to a height of a region (screen) of the lower end portion of the well 32, in which the through holes 31 are formed, as illustrated in FIG. 2. The diameter γ of a pipe refers to a diameter of the pipe 31 installed in the well 32.

According to an alternative embodiment, the decision variable may include other design values, for example, the number of non-powered seawater pumping wells 32 to be installed. In the illustrated embodiment, for convenience of description, the three variables α, β, and γ are assumed to be the decision variables and, accordingly, n decision variable sets D (α, β, γ) may be generated using the optimization algorithm in operation S120.

The optimization algorithm may be one of well-known optimization algorithms such as a genetic algorithm, a neural network algorithm, a particle swarming scheme, a differential evolution scheme, a Newton scheme, and a steepest descent scheme. According to the present embodiment, it is assumed that the genetic algorithm is used. In general, a genetic algorithm is one of representative methods for overcoming optimization problems and is a type of evolutionary computation obtained by imitating biological evolution. The genetic algorithm is an algorithm for representing possible optimal solutions of an objective function in a predetermined form of a data structure and, then, repeatedly searching the solutions to find a most optimal solution.

According to an exemplary embodiment of the present invention, in operation S110, when the initial condition data is input to the genetic algorithm, n decision variable data sets D (α, β, γ) via crossover and mutation may be generated using the genetic algorithm. For example, when 25 decision variable data sets D are set to be generated (i.e., n=25), data sets of $D_1$ (α1, $β_1$, $γ_1$), $D_2$ ($α_2$, $β_2$, $γ_2$), . . . , $D_{25}$ ($α_{25}$, $β_{25}$, $γ_{25}$) may be generated via operation S120.

Then, when n data sets are generated, in operation S130, each of the n data sets may be applied to an underground water flow model to generate n simulation results of change in seawater-fresh water boundary surface. In this case, the used underground water flow model may be, for example, Dong-a University Sharp Interface Model (hereinafter, referred to as "DUSWIM") and may be, but is not limited to, any underground water modeling algorithm as long as the algorithm contains a function of designing a non-powered seawater pumping well.

The function of designing a non-powered seawater pumping well may be a function of comparing a coastal water level and a water level of the non-powered seawater pumping well to determine a pumping amount and may contain the Darcy-Weisbach formula. In addition, the function may include a check valve function of preventing seawater from being inversely injected toward an inland area when a seawater level is high.

When each of the n data sets D generated in operation S120 is applied to the underground water flow model, n prediction results (simulation results) may be generated (S130).

Then, in operation S140, performance evaluation may be performed on each of the n prediction results. According to an exemplary embodiment of the present invention, performance evaluation may be performed by, for example, predefining an evaluation function for performance evaluation and inputting each of the n prediction results to the evaluation function to calculate an evaluation value.

A performance evaluation value with respect to each of the n prediction results may be determined based on a value of a predefined evaluation function. According to an exemplary embodiment of the present invention, the evaluation function may include at least one of "target time ratio", "boundary reduction volume ratio", and "boundary reduction area ratio".

The "target time ratio" may be a term about time taken to reach a specific boundary surface depth and may indicate how fast an effect via seawater pumping is achieved. The non-powered seawater pumping well is a system using a tide level, which is not capable of always pumping water and is capable of pumping water only at a specific time (i.e., when a water level of the non-powered seawater pumping well is higher than a seawater level). According to an exemplary embodiment of the present invention, the target time ratio may be calculated as a ratio of "target boundary arriving time" to "reduced target time".

The "boundary reduction volume ratio" is a condition about a volume among effects of the non-powered seawater pumping well and, in this regard, as the amount of seawater is remarkably reduced, an effect of reduction in seawater intrusion may be enhanced. According to an exemplary embodiment of the present invention, the boundary reduction volume ratio may be calculated as a ratio of "volume affected by seawater after pumping" to "volume affected by seawater prior to pumping".

The "boundary reduction area ratio" may be one of the effects of reduction in seawater intrusion and may be a condition about an area of a region that the effect of reduction in seawater intrusion affects. According to an exemplary embodiment of the present invention, the boundary reduction area ratio may be calculated as a ratio of "area with reduced boundary surface after pumping" to "entire modeling area".

According to an exemplary embodiment of the present invention, the evaluation function may include at least one of "target time ratio", "boundary reduction volume ratio", and "boundary surface reduction area" and may be proportional to the included term. For example, when all of the above three terms are considered, the evaluation function may be defined according to the following equation or an arbitrary function proportional to the following equation.

$$\text{Evaluation Function } (F) = \\ \frac{\text{Target Boundary Arriving Time (after application)}}{\text{Reduced Target Time (prior to application)}} + \\ \frac{\text{Volume affected by Seawater (after application)}}{\text{Volume affected by Seawater (prior to application)}} + \\ \frac{\text{Boundary Reduction Area (after application)}}{\text{Entire Modeling Area (prior to application)}}$$

In this case, three right terms of the above evaluation function may sequentially refer to a target time ratio, a boundary reduction volume ratio, and a boundary reduction area ratio, respectively, from the left.

Referring back to FIG. 11, in operation S140, then performance evaluation values of each of the n simulation result values may be obtained using the evaluation function.

Then, if operation S140 is performed with respect to the last generation of the genetic algorithm, the genetic algorithm may proceed to operation S160 to select the data set D of a decision variable with a maximum value among the n performance evaluation values. However, when a preset last generation number is not reached, the genetic algorithm may return to operation S120 to repeatedly perform operation S120 of generating the n decision variable data sets D, operation S130 of deriving n simulation result values, and operation S140 of calculating n performance evaluation values. In this case, the preset generation number G in the genetic algorithm may be an integer equal to or greater than 2 and may be arbitrarily set as an initial condition by a user.

Figure 13:
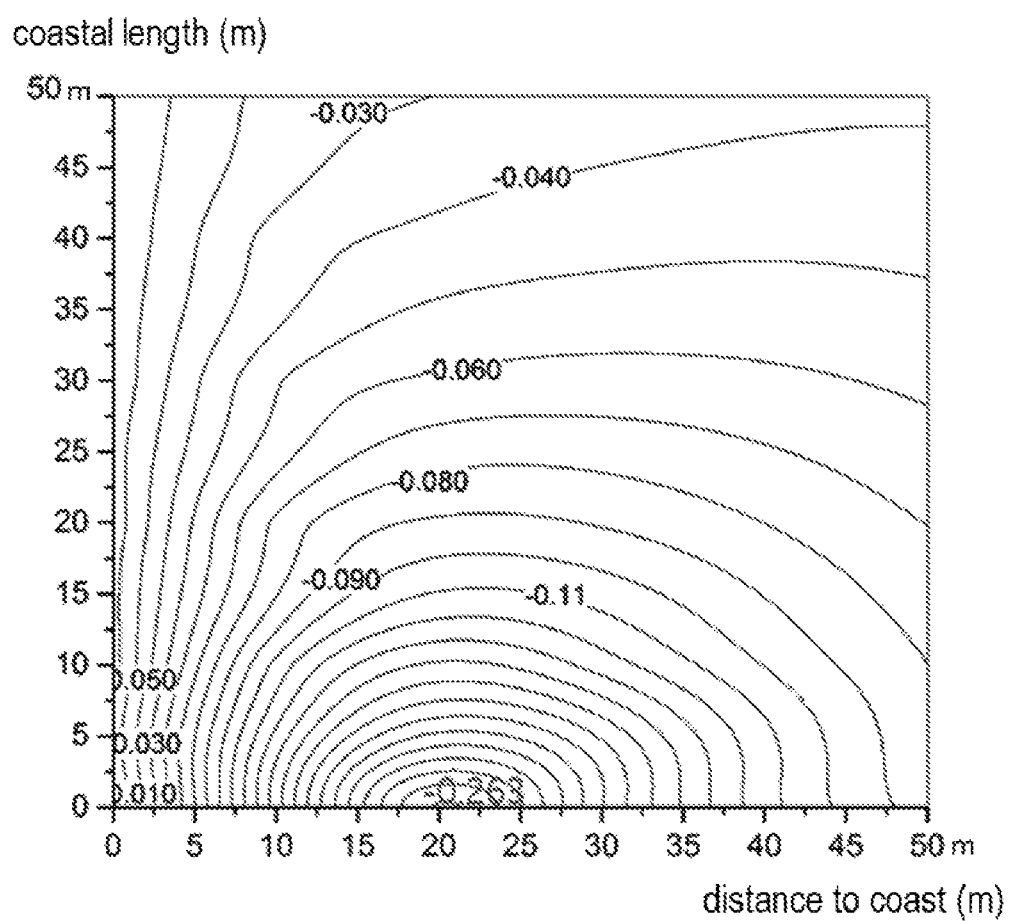
FIG. 13 is a diagram illustrating a result of exemplary optimal design of a seawater pumping well derived by an underground water flow model according to an exemplary embodiment of the present invention.

FIG. 13 is a diagram illustrating a result of exemplary optimal design of a seawater pumping well derived by an underground water flow model according to an exemplary embodiment (FIG. 12) of the present invention. Like in FIG. 12, in FIG. 13, the Y axis indicates a coastline and the X axis indicates a distance from a coastline.

As a result of FIG. 13, the graph shows a change in a boundary surface when the seawater pumping well 32 is installed at a point spaced apart from the coast by about 20 meters, that is, a point (20, 0) and numbers of the graph refer to a lowered height of the seawater-fresh water boundary surface after water is pumped. That is, as seen from the graph of FIG. 13, the boundary surface is lowered by 0.263 m at the point in which the seawater pumping well 32 is installed.

Figure 14:
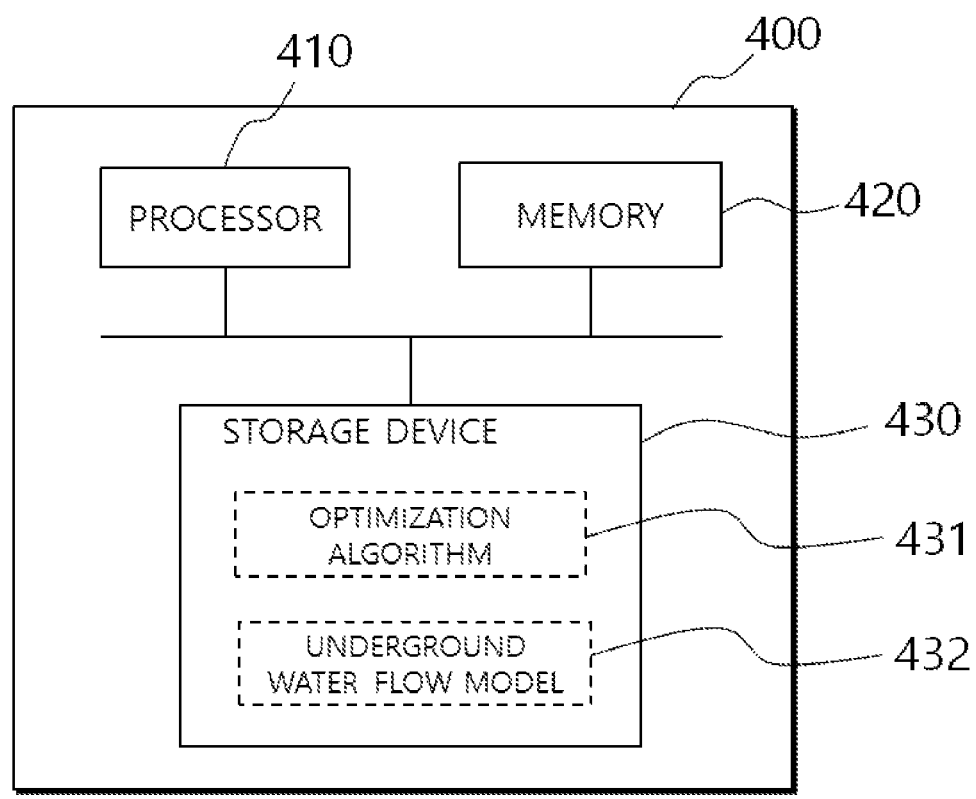
FIG. 14 is a block diagram for explanation of a configuration of an exemplary system for optimal design of a non-powered seawater pumping well according to an exemplary embodiment of the present invention.

FIG. 14 is a block diagram for explanation of a configuration of an exemplary system for optimal design of a non-powered seawater pumping well according to an exemplary embodiment of the present invention.

Referring to FIG. 14, a non-powered seawater pumping well optimization system 400 according to an exemplary embodiment of the present invention may be an arbitrary terminal apparatus or server for executing operations of the flowchart described with reference to FIG. 11 and, as illustrated in the drawing, may include a processor 410, a memory 420, and a storage device 430.

The storage device 430 may be a storage medium that semi-permanently stores data, such as a hard disk drive or a flash memory and may store at least one of the aforementioned various algorithms, for example, an algorithm such as an optimization algorithm 431 such as a genetic algorithm and an underground water flow model 432 such as DUSWIM or programs.

In this configuration, various programs or algorithms may be stored in the storage device 430 and, then, may be loaded and executed in the memory 420 under control of the processor 410. Alternatively, some programs or algorithms may be present in an external server or storage device separately from the optimization system 400 according to the present invention and, when the optimization system 400 transmits data or variables to a corresponding external server or device, the external server or device executes some operations of the program or algorithm and then transmits the resultant data to the optimization system 400.

While the invention has been described with reference to certain preferred embodiments thereof and drawings, the present invention is not limited to the above-described embodiments and various changes or modification may be made based on the descriptions provided herein by those skilled in the art. The scope of the present disclosure should not be limited to and defined by the above-described exemplary embodiments, and should be defined not only by the appended claims but also by the equivalents to the scopes of the claims.

What is claimed is:

1. A non-powered seawater pumping apparatus for reducing seawater intrusion in a land in which an aquifer with a seawater-fresh water boundary surface is formed, the apparatus comprising:
    a pumping pipe having two open end portions, a first end portion of the open end portions being positioned below a sea level and a second end portion being positioned below the seawater-fresh water boundary surface in the land; and
    a well having a cylindrical shape of which an upper portion is opened, the well being disposed to surround a lateral surface of a land-buried portion of the pumping pipe, which is buried in the land, so as to space away the land-buried portion of the pumping pipe from the land,
    wherein:
    the pumping pipe is filled with seawater,
    the well comprises a screen having a plurality of through holes formed along a circumference of the well at a lower end portion of the well,
    the seawater that flows into the well through the through holes is filled up to a groundwater level, and
    when a level of the seawater in the well is higher than the sea level, the non-powered seawater pumping apparatus performs non-powered pumping of the seawater in the pumping pipe to a sea,
    wherein:
    at least one of a location of the well, a screen height of the well, and a diameter of the pumping pipe is determined based on at least one of a target time ratio, a boundary reduction volume ratio, and a boundary reduction area ratio;
    the target time ratio is proportional to a ratio of a target boundary arriving time to a reduced target time;
    the boundary reduction volume ratio is proportional to a ratio of a volume affected by seawater after pumping to a volume affected by seawater prior to pumping; and
    the boundary reduction area ratio is proportional to a ratio of a reduced area of the boundary surface after pumping to an initial area of the boundary surface prior to pumping.

2. The apparatus according to claim 1, further comprising a check valve installed in the pumping pipe and configured to prevent the seawater from flowing backward in a direction toward the second end portion from the first end portion.

3. The apparatus according to claim 1, wherein the through holes of the screen have a diameter that is large enough to allow the seawater to pass through the through holes but small enough to prevent soil of the aquifer from passing through the through holes and a space between the well and the lateral surface of the land-buried portion is at least partially filled with the seawater.

4. The apparatus according to claim 1, wherein at least one of the location of the well, the screen height of the well, and the diameter of the pumping pipe is determined based on a function value of an evaluation function, which is proportional to at least one of the target time ratio, the boundary reduction volume ratio, and the boundary reduction area ratio.

\* \* \* \* \*